(12) United States Patent  
Goldman et al.

(10) Patent No.: US 8,434,044 B1  
(45) Date of Patent: Apr. 30, 2013

(54) SPECIFYING PLACEMENT AND ROUTING CONSTRAINTS FOR SECURITY AND REDUNDANCY

(75) Inventors: David Samuel Goldman, Thornhill (CA); Bruce B. Pedersen, Sunnyvale, CA (US); Gabriel Quan, Toronto (CA); Yuen Ho Choi, Markham (CA)

(73) Assignee: Altera Corporation, San Jose, CA (US)

( * ) Notice: Subject to any disclaimer, the term of this patent is extended or adjusted under 35 U.S.C. 154(b) by 48 days.

(21) Appl. No.: 12/968,128

(22) Filed: Dec. 14, 2010

Related U.S. Application Data

(60) Provisional application No. 61/299,293, filed on Jan. 28, 2010.

(51) Int. Cl.
*G06F 17/50* (2006.01)
*G06F 13/14* (2006.01)

(52) U.S. Cl.
USPC ............ 716/116; 716/100; 716/110; 710/305

(58) Field of Classification Search .................. 716/121, 716/128, 139, 116–119, 126, 138, 100, 110; 710/305–306, 311–312, 266; 326/38, 41, 326/62
See application file for complete search history.

(56) References Cited

U.S. PATENT DOCUMENTS 7,797,651 B1 * 9/2010 Jacobson et al. ............ 716/103
7,949,974 B1 * 5/2011 Moore et al. ................ 716/111

OTHER PUBLICATIONS

Huffinire, Ted, et al., "Moats and Drawbridges: An Isolation Primitive for Reconfigurable Hardware Based Systems," University of California, Santa Barbara, Department of Computer Science, printed Feb. 2010, 15 pages.

McLean, Mark, et al., "FPGA-Based Single Chip Cryptographic Solution (U)," Proceeding of the SDR 06 Technical Conference and Product Exposition, 2006, 4 pages.

* cited by examiner

*Primary Examiner* — Stacy Whitmore
(74) *Attorney, Agent, or Firm* — Weaver Austin Villeneuve & Sampson LLP

(57) ABSTRACT

A programmable chip design tool is provided to enumerate and specify the security and/or redundancy constraints of a programmable chip design. A design is implemented with a high-level security or redundancy scheme, and the programmable chip design tool applies the scheme while simultaneously optimizing for desired metrics (logic density, routability, timing, power, etc.). An underlying assignment scheme as well as user interface components used to enter this assignment scheme are provided.

19 Claims, 10 Drawing Sheets

SPECIFYING PLACEMENT AND ROUTING CONSTRAINTS FOR SECURITY AND REDUNDANCY

CROSS REFERENCE TO RELATED APPLICATION

The application claims the benefit, under 35 U.S.C. §119 (e), of U.S. Provisional Application No. 61/299,293 filed on Jan. 28, 2010 and titled Methods and Apparatus Specifying Placement And Routing Constraints for Security And Redundancy, the entirety of which is incorporated by reference herein for all purposes.

TECHNICAL FIELD

The present disclosure relates to techniques and mechanisms for specifying placement and routing constraints for security and redundancy using programmable chip design tools.

DESCRIPTION OF RELATED ART

Programmable chip design tools such as Field Programmable Gate Array (FPGA) Computer Aided Design (CAD) tools are often used to implement security and redundancy schemes within a design. However, existing tools have limited abilities to apply security and redundancy schemes successfully while optimizing for performance and operational metrics such as logic density, routability, timing, power, etc.

In some available systems, a user of a design tool explicitly instantiates bus macro intellectual property (IP) to route between secured components. Hardware descriptor language (HDL) is explicitly modified, and the bus macro can limit the design tool's ability to meet other constraints, such as timing and power constraints.

BRIEF DESCRIPTION OF THE DRAWINGS

The disclosure may best be understood by reference to the following description taken in conjunction with the accompanying drawings, which illustrate particular embodiments of the present invention.

DETAILED DESCRIPTION

Figure 1:
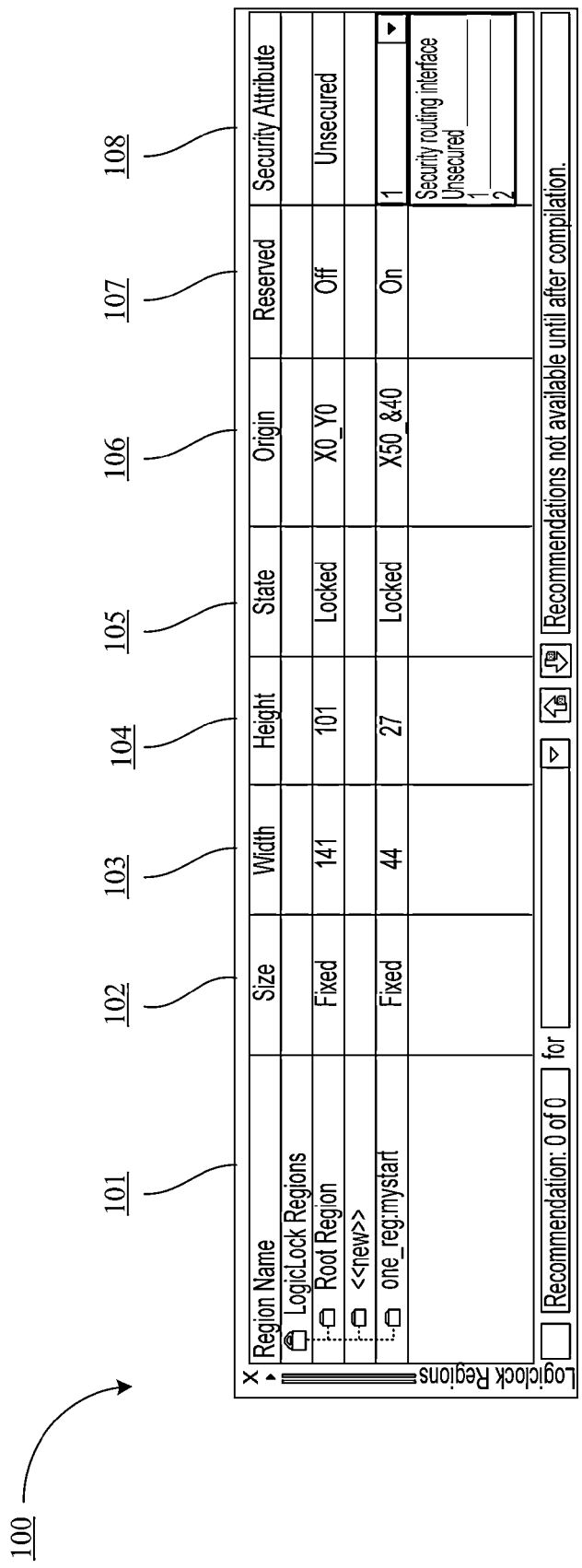
FIG. 1 shows the logic lock regions dialog box and a security attributes menu.

Reference will now be made in detail to embodiments of the present invention contemplated by the inventors for carrying out the invention. Examples of these embodiments are illustrated in the accompanying drawings. While the invention is described in conjunction with these embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques and mechanisms of the present invention will be described in the context of particular types of devices. However, it should be noted that the techniques and mechanisms of the present invention apply to a variety of different types of devices. In the following description, numerous specific details are set forth in order to provide a thorough understanding of the present invention. Particular exemplary embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, a system uses a processor in a variety of contexts. However, it will be appreciated that a system can use multiple processors while remaining within the scope of the present invention unless otherwise noted. Furthermore, the techniques and mechanisms of the present invention will sometimes describe a connection between two entities. It should be noted that a connection between two entities does not necessarily mean a direct, unimpeded connection, as a variety of other entities may reside between the two entities. For example, a processor may be connected to memory, but it will be appreciated that a variety of bridges and controllers may reside between the processor and memory. Consequently, a connection does not necessarily mean a direct, unimpeded connection unless otherwise noted.

Overview

A programmable chip design tool is provided to enumerate and specify the security and/or redundancy constraints of a programmable chip design. A design is implemented with a high-level security or redundancy scheme, and the programmable chip design tool applies the scheme while simultaneously optimizing for desired metrics (logic density, routability, timing, power, etc.). An underlying assignment scheme as well as user interface components used to enter this assignment scheme are provided.

Particular Embodiments

According to various embodiments, a design tool has control over security and placement of a design. In particular embodiments, a design tool can control the placement region location and the shape of isolated logical components, cells, chip layout designs, etc., that have associated input/output (I/O) pins therein. It is appreciated that logical components, intellectual property (IP) components, cells, chip layout designs, etc., may be reusable and are referred to herein as components. Although particular components may be described in various contexts, it should be appreciated that a wide variety of components can be used. Control over the security or isolation level of each component as well as which signals are allowed to cross the boundaries between isolated regions may be desired. These are controlled "inter-region" signals, and typically fit into a higher-level security or isolation algorithm. A design tool allows determination of acceptable paths to route inter-region signals within the overall design floorplan.

Control of these features may be useful when an external tool is used to verify and check design tool output against input constraints or when information leakage prevention is needed. It is appreciated that received constraint information may further improve and prevent information leakage. For example, the constraint information may be received in response to a user input. Typically, a user would want to design a high-level security algorithm and then allow the placement and routing tool to optimize with the security constraints in mind.

One common application of the techniques and mechanisms of the present invention would be the separation of distinct cryptographic components. A common terminology for this type of separation is red/black separation, where "red" components are those that contain classified plaintext, and "black" components are those that do not. The purpose would be to prevent any non-encrypted information from inadvertently leaking between a red component and a black component.

Often, a user may choose to implement redundant, triplicate versions of logic on a programmable chip such as an FPGA. The failure of one copy of a component would not impact the resultant data of that component because the design would automatically take the majority answer from the three copies. In this redundancy scheme, regions are isolated from each other so that each can fail independently. However, it is often desirable to have some inter-region communication over pre-determined channels.

According to various embodiments, the techniques of the present invention allow for the integration of multiple security levels of IP on one chip. Simple to use user interface and graphical user interface components and assignment structures are provided to allow entry of complex security constraints. Output of a design tool such as a CAD tool can be easily verified against a user specification since security constraints are specified as scripting assignments. No modification of HDL or bus macros is required. A design tool has full flexibility to optimize for traditional metrics (timing, power, etc.) while automatically meeting user security constraints.

According to various embodiments, the design tool software includes mechanisms that allow a user to specify which components should be isolated. According to various embodiments, the design tool software provides a dialog box to enter placement information of a secured region. FIG. 1 illustrates a LogicLock Region dialog box 100 wherein the users may specify the location of one or more secured regions. A secured region is a physically isolated and independent region on the device that contains one or more components. For example, a user may specify a secured region and assign to it a processor core as its content. In another example, a user may specify one or more HDL entities and I/O pins as contents of a secured region. In various embodiments, the user may specify other placement information of a designated secured region 101 such as size 102, width 103, height 104, state 105, origin 106, reserved 107, etc. Size 102 may include possible values of auto or fixed. If the user selects auto, then the design tool software automatically determines the size of the secured region. If the user selects fixed size, then the user can define the shape and size of the secured region.

In particular embodiments, rather than specifying a particular height and width, the user specifies a non-rectangular shape as the region's logic area. State 105 may include possible values of floating or locked wherein a floating state allows the design tool software to determine the location of the secured region and locked state allows the user to define the location. Origin 106 defines the placement of a secured region on a programmable chip. Reserved 107 may include possible values of on or off indicating if the physical region bounded by the region is reserved to for use by only logic assigned to it. In a typical secured region, this setting would be set to "on" indicating that no external logic may be placed in the region.

Additionally, the user may specify security level information of a secured region. According to various embodiments, a security level or a security policy for a component and/or an inter-region signal is referred to herein as security level information. The secured region is associated with a security attribute 108. The security attribute 108 may include multiple values such as unsecured, isolated and security routing interface. If the user selects unsecured, then the design tool software disables constraints for physical isolation for the designated region. If the user selects isolated, the design tool software creates a secured region. The secured region is physically isolated by restricting the routing resources from leaving the secured region. In particular embodiments, an isolated region is provided as two levels of security. FIG. 1 shows an isolated region as two levels of security: security level 1 and security level 2. In one example, security level 1 is secret and security level 2 is top secret. In another embodiment, the levels may represent prevention of an information "leak" in k or fewer single event upsets (SEUs), transistor faults, etc. For example, a signal may be leaked after two transistor faults under security level 2 while a signal may be leaked after one transistor fault under security level 1. In another example, a security level 1 may represent a certain number of SEU upsets and security level 2 may represent a certain number of transistor faults. It should be noted that a variety of security levels are possible for an isolated region. In various embodiments, the user may specify and define a variety of security levels for an isolated region.

In another embodiment, the security attribute 108 may include the value of a security routing interface. According to various embodiments, a security routing interface is a secured region that is used as an interface between a secured region and unsecured region or between two secured regions. The interface creates a secured routing channel for signals to enter or exit a secured region. It should be noted, only routing resources (no logic) may be used within a Security Routing Interface region.

In particular embodiments, the tool automatically determines the placement and security information of the secured region. According to various embodiments, the design tool software provides a user a visual tool 200 to specify secured regions. The visual tool 200 provides a visual floorplan of the device and available resources. This allows manipulation of the shape and size location constraints on the floorplan of the device. In particular examples, scripts may be used to assign secured regions on a device.

Figure 2:
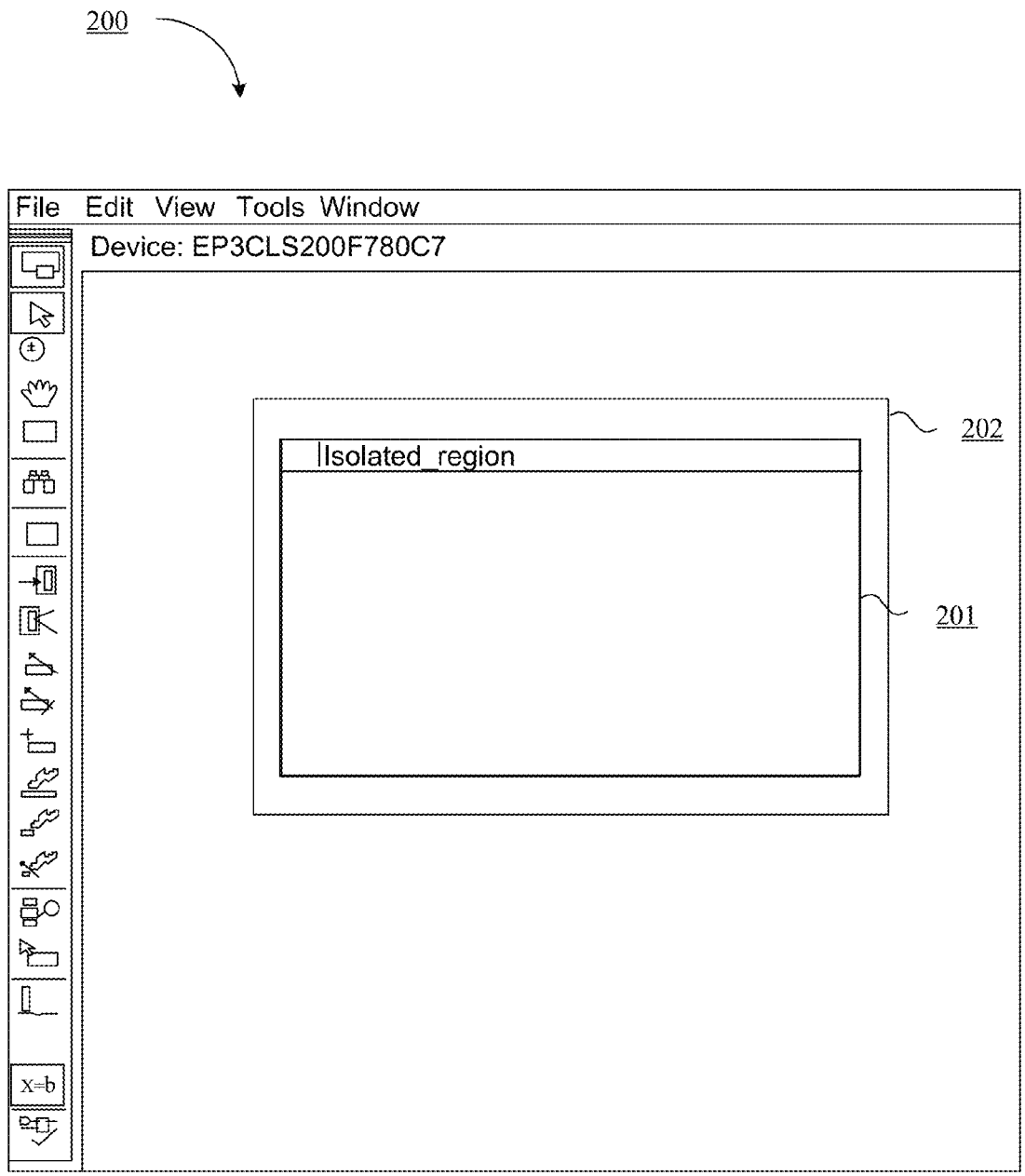
FIG. 2 illustrates one example of an isolated region.

According to various embodiments, once a secured region is designated, the design tool software automatically adds a fencing region to a secured region. FIG. 2 illustrates one example of a secured region 201 and a fence 202 surrounding the secured region 201. Fences are mechanisms used to prevent signals from entering or exiting a secured region. Additionally, no logic may be placed in the fence. According to various embodiments, a fence is a boundary of unused Logic Array Blocks (LABs). By restricting routing resources and providing a physical guard band of unused logic, faults or unintended signals originating in one secured region are prevented from adversely affecting any other design blocks on the device. In various embodiments, the design tool software automatically determines the size of the fence based upon the structure of the underlying circuitry and the security level selected for the secured region.

Generally, a secured region does not work in complete isolation. The design tool software provides a mechanism to assign inter-region signals. Inter-region signals are "approved" signals that may enter and/or exit a secured region. According to various embodiments, this is accomplished by designating a security routing interface region on the device. As noted previously, a security routing interface region is a secure routing channel for signals to enter and exit a secured region. A security interface region may connect two secured regions, or a secured region to one or more unsecured regions. Once a security routing interface is designated, inter-region signals may be assigned to the security routing interface region. According to various embodiments, signals that are assigned to a security routing interface region may use the routing resources that are physically located in that security routing interface region. Thus, a signal may not enter a security routing interface to which it is not assigned.

Figure 3:
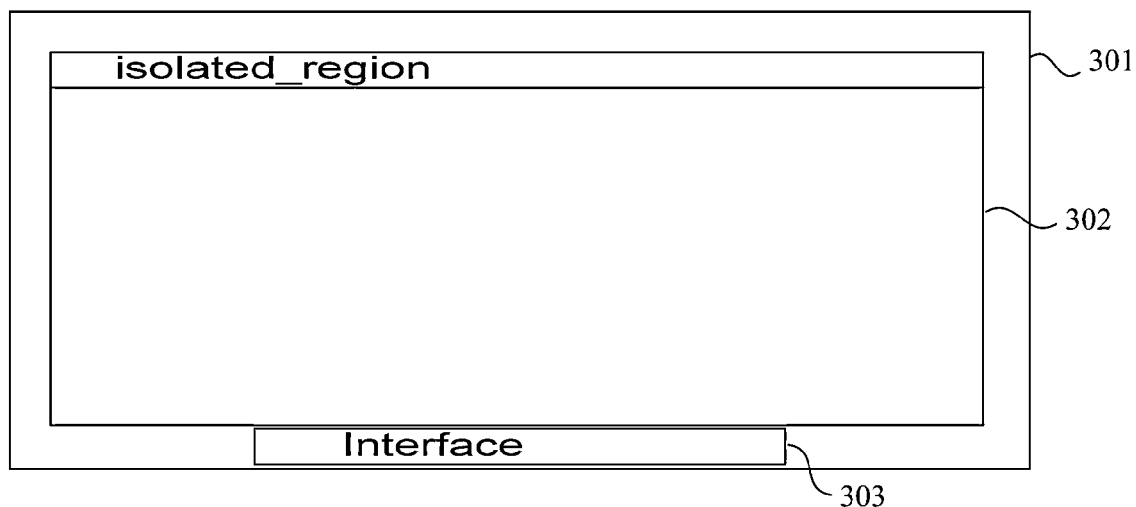
FIG. 3 shows an interface that allows for signals to be promoted from unsecured logic into a secured region, and/or signals to be demoted from a secured region into unsecured logic.

FIG. 3 illustrates one example of a secured region 302 interfaced with an unsecured region. The secured region 302 is surrounded by a fence 301. Signals assigned to the security routing interface region 303 are "approved" signals that are allowed to enter from the unsecured region into a secured region, and/or exit from a secured region into an unsecured logic via the security routing interface region 303. For example, a user may assign secured region 302 to a security level 2. Further, secured region 302 may have an output signal my_output (not shown) with an assigned security level of "unsecured." When the user assigns signal my_output to security routing interface region 303, then my_output is an "approved" signal to exit secured region 302.

Figure 4:
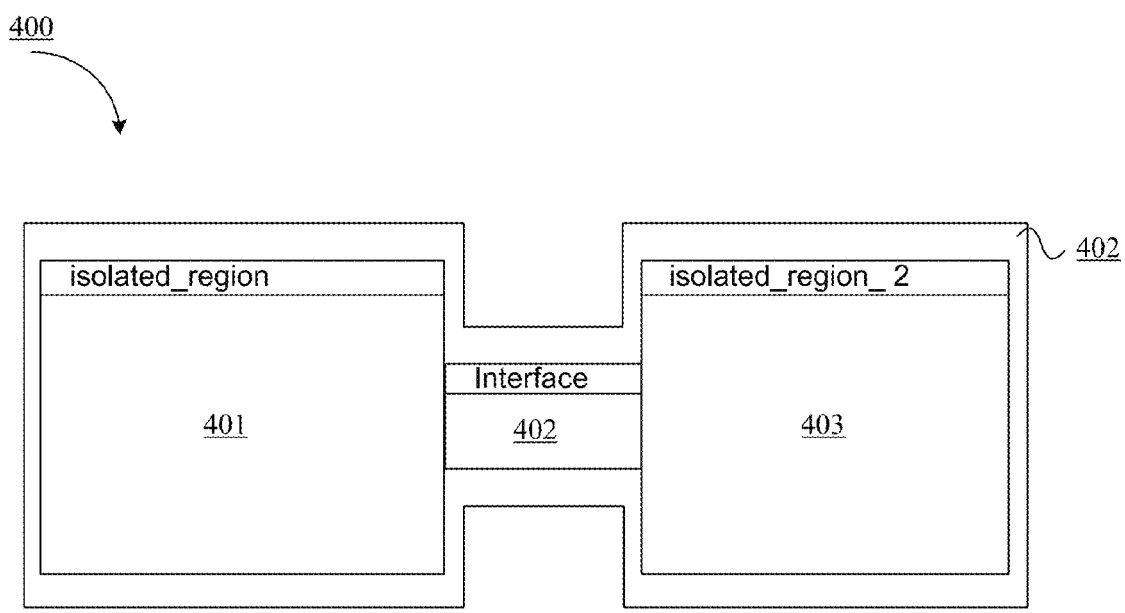
FIG. 4 shows a security routing interface that is used to connect two secured regions.

FIG. 4 illustrates one example of two secured regions 401, 403 interfaced with security routing interface region 402. The design tool software automatically creates a fence 404 around the security routing interface region 402 and the secured regions 401, 403. The security routing interface region 402 is fenced in addition to the secured regions 401, 403 to ensure that the secured signals are isolated from unsecured signals.

According to various embodiments, only inter-region signals may enter and exit a secured region. Each signal that enters or exits a secured region can be assigned to a security routing interface region. In particular embodiments, a security routing interface for various signals can be specified. Additionally, each signal may be associated with a security attribute. A signal may not connect to logic with a lower security level than the logic from which the signal originals without an explicit security attribute indicating that this connection is valid. According to various embodiments, the design tool software includes a mechanism to assign the signal security attribute and assign the signal to a security routing interface region.

Figure 5:
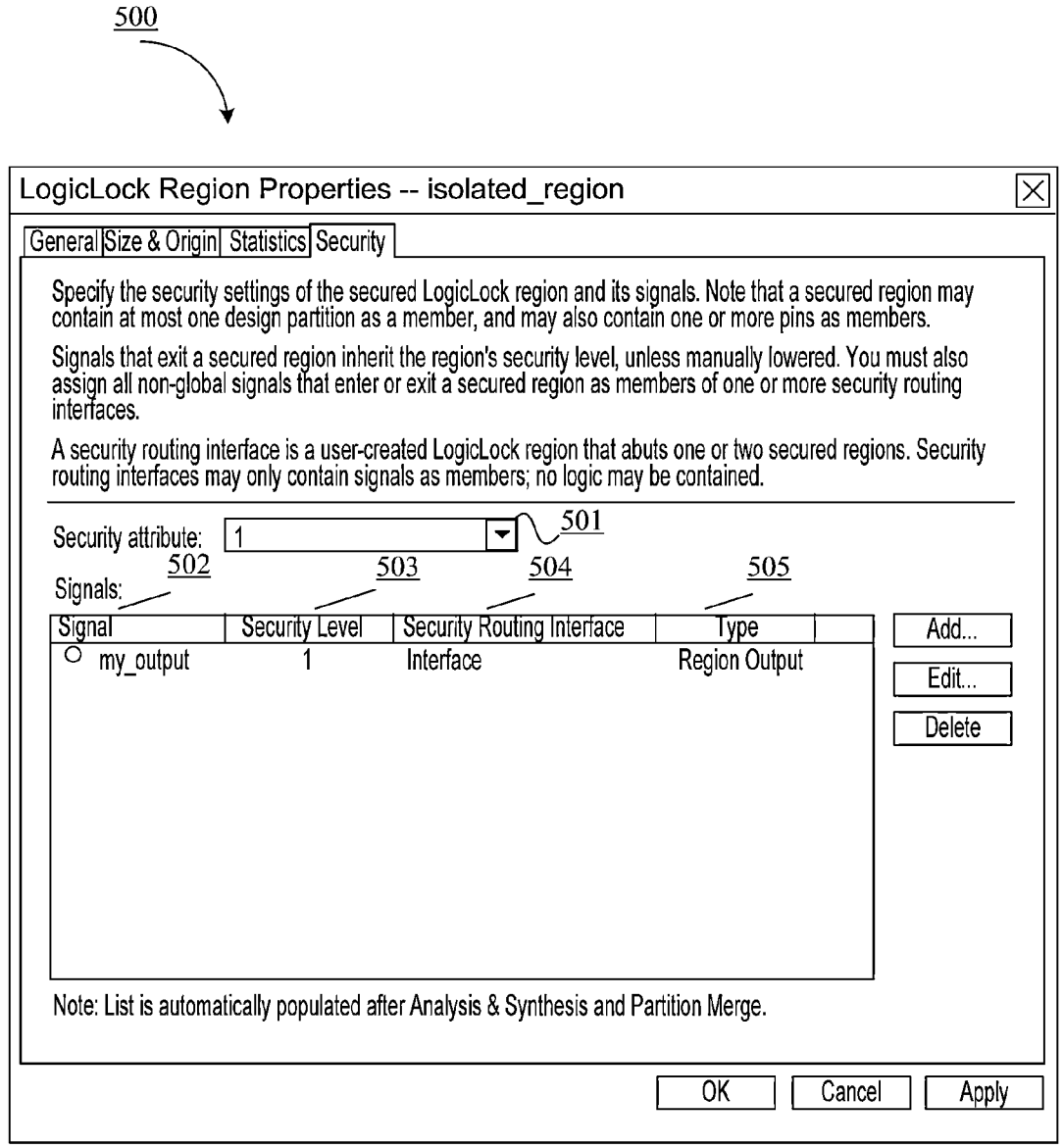
FIG. 5 shows a mechanism in which users can enter the security constraints for inter-region signals.

FIG. 5 depicts an embodiment of a dialog box for specifying the security settings of a secured region and signals in the secured region. According to various embodiments, the design tool software automatically populates the dialog box 500 with the secured region's security attribute 501 and I/O signals 502. For instance, FIG. 5 depicts the security attribute and all of the I/O signals of the secured region isolated_region. In this example, isolated_region has one signal called my_output. For each signal, the user may select a security level 503, and one or more security routing interfaces 504. The type 505, is a property of the signal and is automatically populated based on the topology of the design. A security level may include multiple choices such as auto, unsecured, 1 and 2. In particular embodiments, the design tool software defaults all signals to auto. A signal with a security level auto takes on the security level of the region from which the signal originates. In this example, isolated_region has a security attribute of 1 and signal my_output automatically inherits the security level 1. However, if the signal is to route to a secured region of lower security level than its originating region, then the user can specify a lower security level for the signal. For example, isolated_region may have a security level of 2 (not shown) and signal my_output is destined to a secured region, outside_region (not shown) with a security level 1. Then the user may assign a security level 1 to signal my_output.

Figure 6:
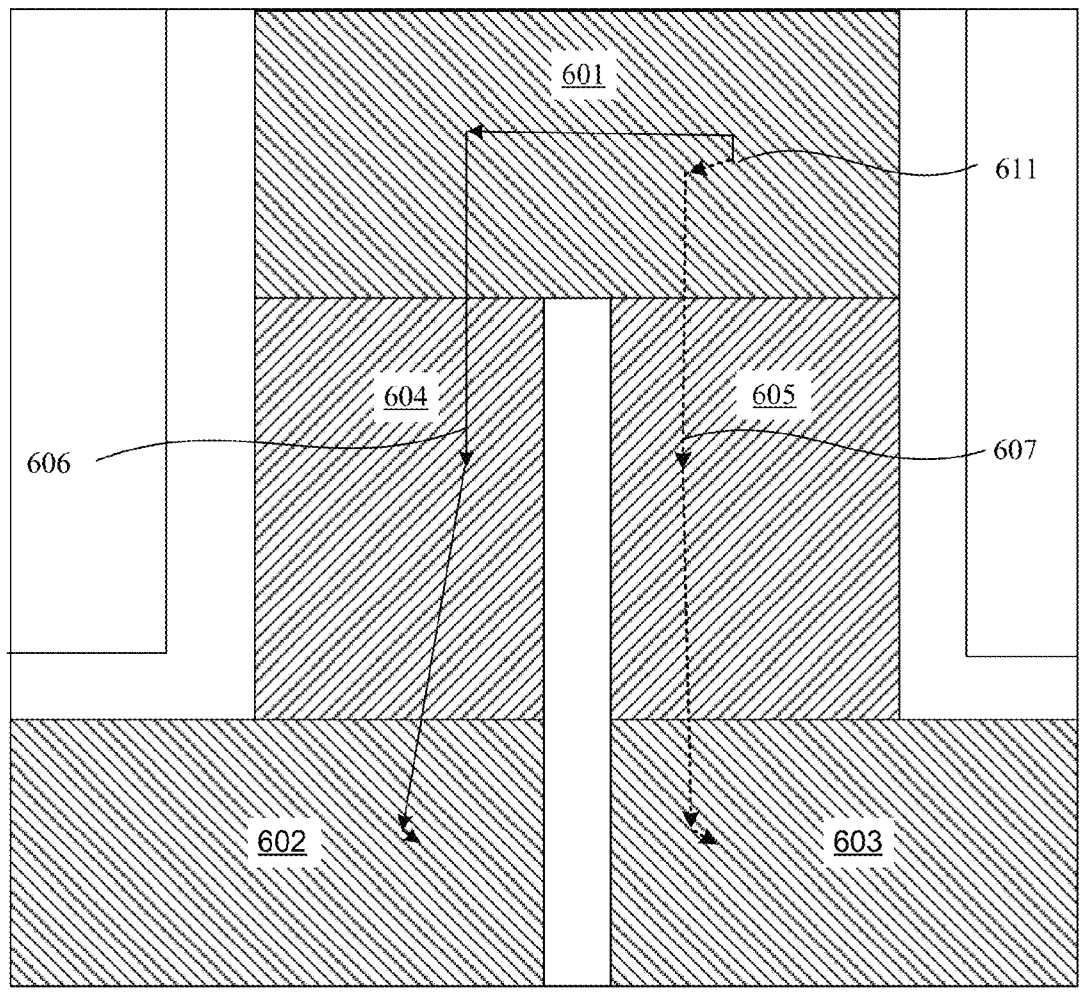
FIG. 6 shows a single signal routing through two separate security routing interfaces to two distinct destination regions.

According to various embodiments, the user specifies which security routing interface 504 each signal will be routed through. Each inter-region signal may be assigned to a security routing interface region. An inter-region signal may be assigned to one or multiple security routing interface regions. In various embodiments, a signal may be fanned out to multiple secured regions. The user may assign the signal to one interface region per destination region. FIG. 6 illustrates an example of routing a single signal 603 to multiple destinations. Signal 611 fans out from the originating secured region 601 and routes through the assigned security routing interfaces 604 and 605 to two distinct destination regions 602 and 603 through paths 606 and 607. A fence is created around each of the areas 604 and 605. In various embodiments, a visual tool similar to one depicted in FIG. 6 may be used to assign signals to a security routing interface region. In particular embodiments, the dialog box 500 may provide a drop down menu to assign signals to one or more security routing interface regions. In another embodiment, the design tool software automatically assigns the signals to one or more security routing interface regions based on design topology, efficiency, logic density, routability, timing, power or any other combination.

In reference to FIG. 5, each signal has a type 505. In various embodiments, type may have values of "Region Input" or "Region Output" which indicate whether the signal is an output or an input to the secured region. These values are automatically populated and assigned by the design tool software and are inferred from the topology of the design, based on the connectivity in the RTL. In various embodiments, the outputs of one secured regions may be the inputs of another secured region. The design tool software automatically reflects this relationship in each secured region's security property dialog box.

The design tool software provides a mechanism to design a device using a graphical user interface, using a command-line executables, using scripts, and/or using any combination thereof. In various embodiments, a script is provided to the design tool software. The design tool software reads the script and assigns secured regions and signals based on the floorplan specification programmed in the script. The script read in by the design tool software may be of various scripting languages such as Tool Command Language (TCL), Perl, Python and the like. In another embodiment, a scripted is provided to the design tool software to assign secured regions and graphical tools and wizards are used to assign security levels to the signals.

The following is an example of a TCL syntax to assign secured regions and security levels that may be provided to the design tool software.
LL_SECURITY_ROUTING_INTERFACE
This command changes a LogicLock region assignment to a Security Routing Interface.
Type: Boolean; (ON/OFF—Defaults to OFF)

Syntax:
set_global_assignment -name LL_SECURITY_ROUTING_INTERFACE <value> -section_id <section_identifier>

LL_REGION_SECURITY_LEVEL
This command identifies the security level of a LogicLock region.
Type: Enumeration—defaults to UNSECURED
   C1
   C2
   UNSECURED
Syntax:
set_global_assignment -name LL_REGION_SECURITY_LEVEL <value> -section_id <section_identifier>

LL_MEMBER_OF_SECURITY_ROUTING_INTERFACE
This command assigns a signal I/O from a secured region to a Security Routing Interface. Both value and section ID denotes the name of the routing interface region. <to > specifies the name of the signal.
Type: String
Syntax:
set_instance_assignment -name \ LL_MEMBER_OF_SECURITY_ROUTING_INTERFACE <value> -to <to > -section_id <section_id>

LL_SIGNAL_SECURITY_LEVEL
This command sets the security level of a signal. The default value is the security level of the region that generates the signal. This assignment may only be used to lower a security level.
Type: Enumeration
   UNSECURED
   C1
   C2
Syntax:
set_instance_assignment -name LL_SIGNAL_SECURITY_LEVEL <value> -to <to > -section_id <section_id>

As the examples illustrate, the mechanisms of the present invention allow efficient design of a complex security scheme on a single device. The mechanisms of the present invention allow control of the location and placement of isolated components and associated I/O pins, determination of the security level of the components, determination of signals allowed in and out of a secured region, and identification of the locations of wires and paths to route inter-region signals within the overall design floorplan. Various embodiments of the present invention do not require manual modification of HDL or use bus macros to achieve the desired security scheme. A high level security scheme can be implemented using design tool software that generates the design in light of the security constraints.

Figure 7:
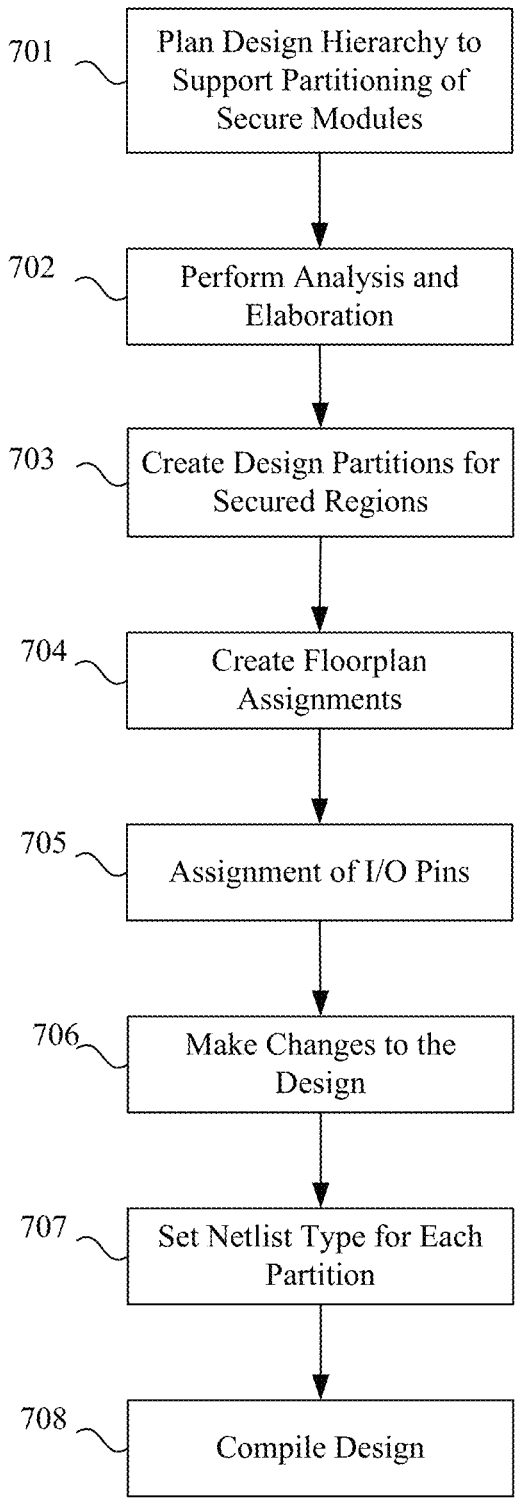
FIG. 7 illustrates an incremental compilation flow.

FIG. 7 is a diagrammatic representation of an incremental compilation flow that uses the techniques of the present invention to isolate design partitions into physically independent regions. At 701, a design hierarchy to support partitioning of secured regions is established. At 702, the design tool software performs analysis and elaboration to identify the design hierarchy. In various embodiments, the analysis and elaboration is performed by a synthesis tool. At 703, the user may designate specific instances in the design hierarchy as design partitions. A design partition is a logical boundary. The logical boundary sets a virtual boundary between design hierarchies. For example, the user may designate design partitions for each secured region. In various embodiments, the user may designate design partitions using a graphical tool, a schematic capture, a text based design entry, etc. In particular embodiments, the design tool software automatically creates partitions based on the size and connectivity of the hierarchical design blocks.

At 704, the design tool software creates the design floorplan based on a secured region's placement region information and security level information. Further, the user may assign other attributes to the secured region such as the security attribute, location, origin, size, etc. Based on the location and security assignments, the design tool software maps the design partitions to the physical resources on the device floorplan. According to various embodiments, the design tool software automatically creates fencing regions to isolate the secured region. In particular embodiments, the user may assign floorplan locations using a visual tool, a schematic capture, a text based design entry, etc.

Figure 8:
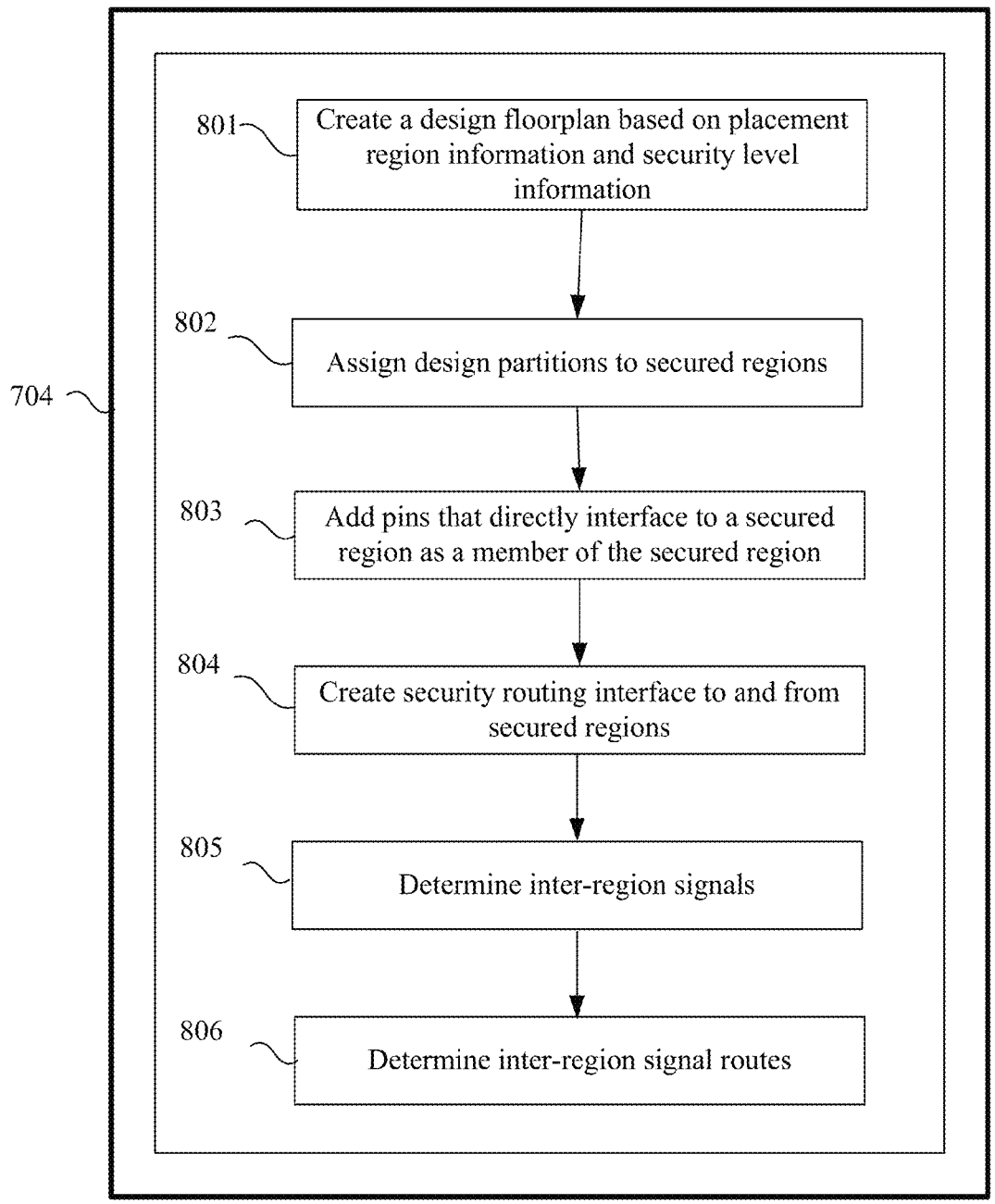
FIG. 8 illustrates a floorplanning assignment scheme.

FIG. 8 is a diagrammatic representation of a floorplanning assignment scheme 704 that uses various techniques of the present invention. At 801, the design tool software receives placement region information and the security level information for each component designated as a secured region. Based on the placement region information and the security level information, the design tool software creates a floorplan. According to various embodiments, the design tool automatically optimizes the device design for logic density, routability, timing, power, etc. At 802, the user assigns a design partition to a secured region on the device's floorplan. Designating physical locations to design partitions separates the design partitions from each other and from the other hierarchy blocks on the device. In particular embodiments, the design tool automatically designates a design partition to a secured region on the device's floorplan.

At 803, the user assigns I/O pins as members of secured region(s). In particular embodiments, the design tool software automatically assigns I/O pins as members of one or more secured regions. For example, the user may add I/O pins as members of a secured region using a dialog box. The user may click an add button to enter additional I/O pins as members of a secured region. For instance, the user may add an input pin my_input (not depicted) to secured region isolated_region by clicking on the add button. In particular embodiments, the user may add I/O pins using a visual tool, a schematic capture, a text based design entry, etc.

At 804, the design tool software receives placement region information and security level information for security routing interfaces. According to various embodiments, a secured region is assigned to the security attribute Security Routing Interface using a graphical tool similar to the one depicted in FIG. 1. In various embodiments, the security routing interface is designated using a graphical tool, a schematic capture, a text based design entry, etc. Each security routing interface may abut one or more secured regions. The design tool software designates security routing interface regions on the device floorplan based on placement region information and security level information. In various embodiments, the design tool software automatically creates a fence around the security routing interface region and the abutted secured regions. In particular embodiments, the design tool software ensures and verifies that no logic is designed or placed in the security routing interface region.

At 805, the design tool software determines inter-region signals that are allowed to cross boundaries between secured regions. According to various embodiments, the design tool software automatically determines inter-region signals after analysis and synthesis. At 806, the design tool software automatically determines acceptable inter-region signal paths while simultaneously performing optimization for logic density, routability, timing, power, etc. In another embodiment, the user designates inter region signal paths and the design tool software assigns paths according to the user input. The user may designate the destination region for a signal using a graphical tool, a schematic capture, a text based design entry, etc.

According to various embodiments, the design software design tool assigns proper I/O pin assignments to ensure secured regions are completely isolated. For example, if the secured region contains I/O pins as members, the software design tool assigns the entire I/O bank as a member of the secured region that sinks or sources the I/O pin. At 706, a floorplan is adjusted. The floorplan and assignments may be adjusted anytime during the assignment scheme to achieve a floorplan that meets the design requirements. At 707, the netlist type of each design partition is set to include previously complied netlists, where applicable in an incremental compilation. At 708, the design tool software compiles the design.

Figure 9:
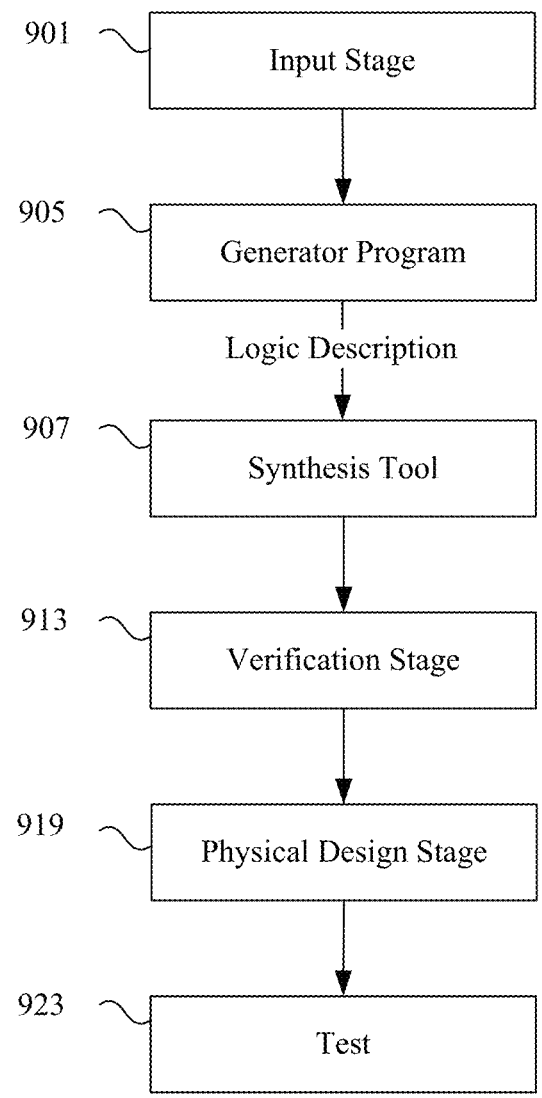
FIG. 9 illustrates a technique for implementing a programmable chip.

FIG. 9 is a diagrammatic representation showing implementation of an electronic device that can use the techniques of the present invention. An input stage 901 receives selection information typically from a user for logic such as a processor core as well as other components to be implemented on an electronic device. In one example, the input received is in the form of a high-level language program. A generator program 905 creates a logic description and provides the logic description along with other customized logic to any of a variety of synthesis tools, place and route programs, and logic configuration tools to allow a logic description to be implemented on an electronic device.

In one example, an input stage 901 often allows selection and parameterization of components to be used on an electronic device. The input stage 901 also allows configuration of hard coded logic. In some examples, components provided to an input stage include intellectual property functions, megafunctions, and intellectual property cores. The input stage 901 may be a graphical user interface using wizards for allowing efficient or convenient entry of information. The input stage may also be a text interface or a program reading a data file such as a spreadsheet, database table, or schematic to acquire selection information. The input stage 901 produces an output containing information about the various modules selected. At this stage, the user may enter security information about individual components that needs to be isolated. For example, different levels of component security and which components are allowed to communicate with each other may be entered. Embodiments of a graphical interface to enter security information are depicted in FIGS. 1 and 6.

In typical implementations, the generator program 905 can identify the selections and generate a logic description with information for implementing the various modules. The generator program 905 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 905 identifies pointers and provides ports for each pointer. One tool with generator program capabilities is System on a Programmable Chip (SOPC) Builder available from Altera Corporation of San Jose, Calif. The generator program 905 also provides information to a synthesis tool 907 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 909.

As will be appreciated by one of skill in the art, the input stage 901, generator program 905, and synthesis tool 907 can be separate programs. The interface between the separate programs can be a database file, a log, or simply messages transmitted between the programs. For example, instead of writing a file to storage, the input stage 901 can send messages directly to the generator program 905 to allow the generator program to create a logic description. Similarly, the generator program can provide information directly to the synthesis tool instead of writing HDL files. Similarly, input stage 901, generator program 905, and synthesis tool 907 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 907.

A synthesis tool 907 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 913 typically follows the synthesis stage 907. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 913, the synthesized netlist file can be provided to physical design tools 919 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 923.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 901, the generator program 905, the synthesis tool 907, the verification tools 913, and physical design tools 919 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 10:
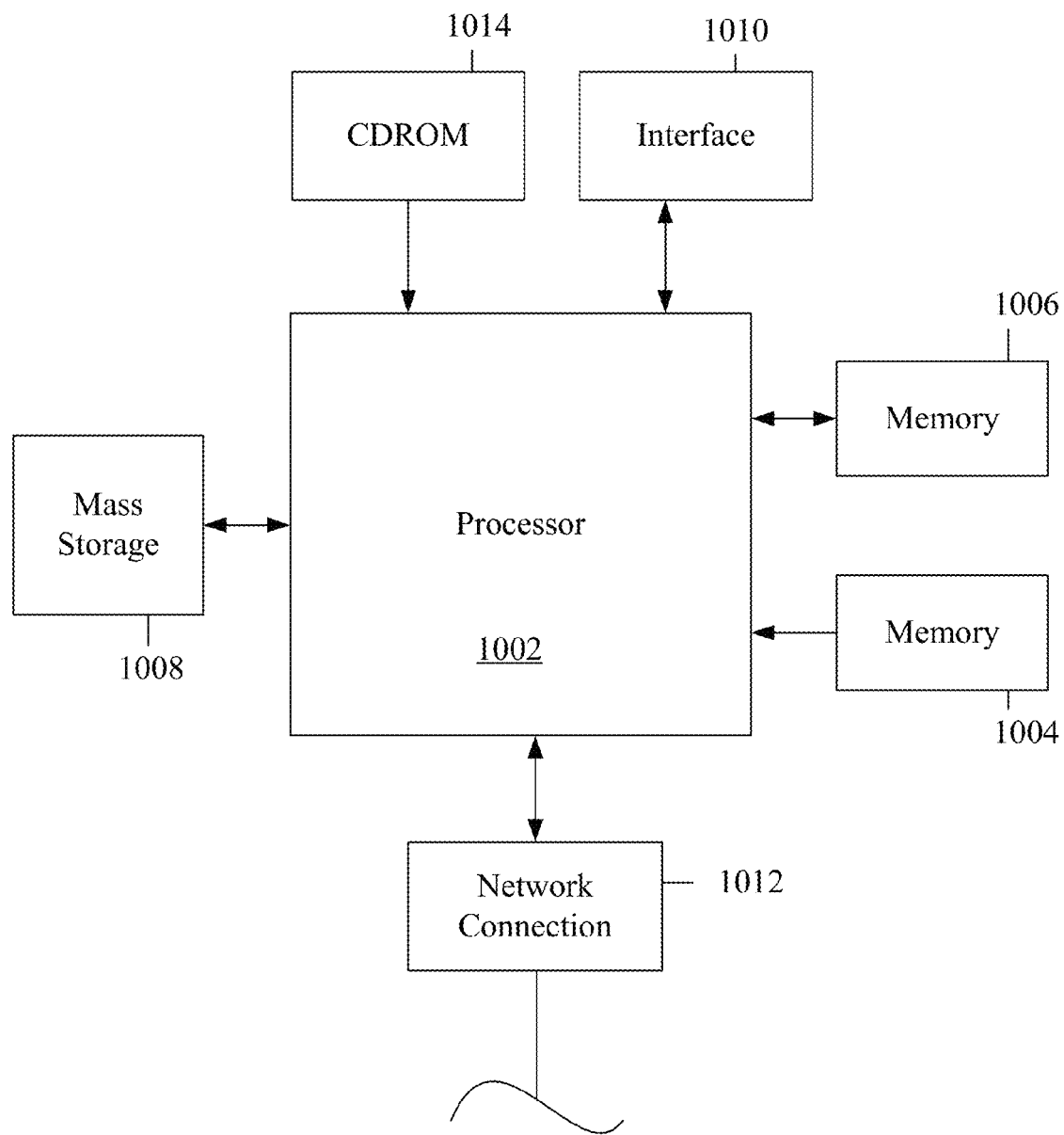
FIG. 10 illustrates one example of a computer system.

FIG. 10 is a diagrammatic representation showing a typical computer system that can be used to implement a programmable chip having distinct isolated components. The computer system 800 includes any number of processors 1002 (also referred to as central processing units, or CPUs) that are coupled to devices including memory 1006 (typically a random access memory, or "RAM"), memory 1004 (typically a read only memory, or "ROM"). The processors 1002 can be configured to generate an electronic design. As is well known in the art, memory 1004 acts to transfer data and instructions uni-directionally to the CPU and memory 1006 are used typically to transfer data and instructions in a bi-directional manner.

Both of these memory devices may include any suitable type of the computer-readable media described above. A mass storage device 1008 is also coupled bi-directionally to CPU 1002 and provides additional data storage capacity and may include any of the computer-readable media described above. The mass storage device 1008 may be used to store programs, data and the like and is typically a secondary storage medium such as a hard disk that is slower than memory. The mass storage device 1008 can be used to hold a library or database of prepackaged logic or intellectual property functions, as well as information on generating particular configurations. It will be appreciated that the information retained within the mass storage device 1008, may, in appropriate cases, be incorporated in standard fashion as part of memory 1006 as virtual memory. A specific mass storage device such as a CD-ROM 1014 may also pass data uni-directionally to the CPU.

CPU 1002 is also coupled to an interface 1010 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1002 may be a design tool processor. Finally, CPU 1002 optionally may be coupled to a computer or telecommunications network using a network connection as shown generally at 1012. With such a network connection, it is contemplated that the CPU might receive information from the network, or might output information to the network in the course of performing the above-described process steps. It should be noted that the system 800 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A method, comprising:
   determining, with a processor configured to run a design tool, inter-region signals operable to cross boundaries between a first component and a second component, the processor accepting as user inputs placement region information and security level information for the first component and the second component; and
   determining, with the design tool, locations of acceptable paths to route inter-region signals, each of the acceptable paths comprising at least one line,
   wherein determining the inter-region signals and determining the location of acceptable paths is performed by optimization using metrics selected from a group consisting of logic density, routability, timing and power, without regard to bus macros.

2. The method of claim 1, wherein a secure channel is an interface between the first component and the second component.

3. The method of claim 1, wherein the security level information identifies a security level of an inter-region signal as isolated.

4. The method of claim 1, wherein the security level information identifies a security level of an inter-region signal as unsecured.

5. The method of claim 1, wherein placement region information is selected from a group consisting of size, width, height, state and origin.

6. The method of claim 1, wherein the security level information includes a security level for the first component.

7. The method of claim 6, wherein the security level of the first component is isolated, wherein the first component is isolated by restricting connections to the first component.

8. The method of claim 7, wherein the first component is fenced.

9. The method of claim 1, wherein the first component is a first intellectual property (IP) component.

10. A system, comprising:
    an interface configured to receive placement region information associated with a first component and a second component, and security level information associated with the first component and the second component; and a processor configured run a design tool, the design tool configured to determine inter-region signals operable to cross boundaries between the first component and the second component, and determine locations of acceptable paths to route inter-region signals, each of the acceptable paths comprising at least one line, wherein determining the inter-region signals and determining the location of acceptable paths is performed by optimization using metrics selected from a group consisting of logic density, routability, timing and power, without regard to bus macros.

11. The system of claim 10, wherein a secure channel is an interface between the first component and the second component.

12. The system of claim 10, wherein the security level information identifies a security level of an inter-region signal as isolated.

13. The system of claim 10, wherein the security level information identifies a security level of an inter-region signal as unsecured.

14. The system of claim 10, wherein placement region information is selected from a group consisting of size, width, height, state and origin.

15. The system of claim 10, wherein the security level information includes a security level for the first component.

16. The system of claim 15, wherein the security level of the first component is isolated, wherein the first component is isolated by restricting connections to the first component.

17. The system of claim 16, wherein the first component is fenced.

18. The system of claim 10, wherein the first component is a first intellectual property (IP) component.

19. A non-transitory computer readable medium having instructions stored thereon that, if executed by a computing device, cause the computing device to perform operations comprising:

receiving placement region information for a first IP component and a second IP component;

receiving security level information for the first IP component and the second IP component;

configuring a processor to a run design tool configured to determine inter-region signals that are allowed to cross boundaries between the first IP component and the second IP component; and determining, with the design tool, locations of acceptable paths to route inter-region signals, each of the acceptable paths comprising a plurality of possible lines, wherein determining the inter-region signals and determining the location of acceptable paths is performed by optimization using metrics selected from a group consisting of logic density, routability, timing and power, without regard to bus macros.

* * * * *